(12) United States Patent
Liu et al.

(10) Patent No.: US 8,846,476 B2
(45) Date of Patent: Sep. 30, 2014

(54) METHODS OF FORMING MULTIPLE N-TYPE SEMICONDUCTOR DEVICES WITH DIFFERENT THRESHOLD VOLTAGES ON A SEMICONDUCTOR SUBSTRATE

(71) Applicant: GLOBALFOUNDRIES Inc., Grand Cayman (KY)

(72) Inventors: Yanxiang Liu, Wappinger Falls, NY (US); Manfred Eller, Beacon, NY (US); Johannes van Meer, Newburgh, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 73 days.

(21) Appl. No.: 13/766,922

(22) Filed: Feb. 14, 2013

(65) Prior Publication Data
US 2014/0227845 A1    Aug. 14, 2014

(51) Int. Cl.
*H01L 21/8236* (2006.01)
*H01L 21/336* (2006.01)
*H01L 21/8234* (2006.01)

(52) U.S. Cl.
CPC ............................. *H01L 21/823412* (2013.01)
USPC .......................................... 438/276; 438/289

(58) Field of Classification Search
None
See application file for complete search history.

(56) References Cited

U.S. PATENT DOCUMENTS

| | | | |
|---|---|---|---|
| 6,114,206 A * | 9/2000 | Yu | 438/270 |
| 6,514,824 B1 * | 2/2003 | Randazzo et al. | 438/283 |
| 6,872,978 B2 * | 3/2005 | Zhang et al. | 257/66 |
| 7,692,238 B2 | 4/2010 | Nihei | |
| 8,563,382 B2 * | 10/2013 | Nishikawa | 438/285 |
| 8,679,928 B2 * | 3/2014 | Bhattacharyya et al. | 438/289 |
| 2005/0287952 A1 | 12/2005 | Ryan et al. | |
| 2006/0143454 A1 | 6/2006 | Walmsley | |
| 2007/0267635 A1 | 11/2007 | Chang et al. | |
| 2008/0124858 A1 * | 5/2008 | Nguyen et al. | 438/217 |
| 2009/0121273 A1 | 5/2009 | King et al. | |
| 2011/0269281 A1 | 11/2011 | Clifton | |

* cited by examiner

*Primary Examiner* — Scott B Geyer
(74) *Attorney, Agent, or Firm* — Amerson Law Firm, PLLC

(57) ABSTRACT

One illustrative method disclosed herein involves forming an integrated circuit product comprised of first and second N-type transistors formed in and above first and second active regions, respectively. The method generally involves performing a common threshold voltage adjusting ion implantation process on the first and second active regions, forming the first and second transistors, performing an amorphization ion implantation process to selectively form regions of amorphous material in the first active region but not in the second active region, after performing the amorphization ion implantation process, forming a capping material layer above the first and second transistors and performing a re-crystallization anneal process to convert at least portions of the regions of amorphous material to a crystalline material. In some cases, the capping material layer may be formed of a material having a Young's modulus of at least 180 GPa.

31 Claims, 7 Drawing Sheets

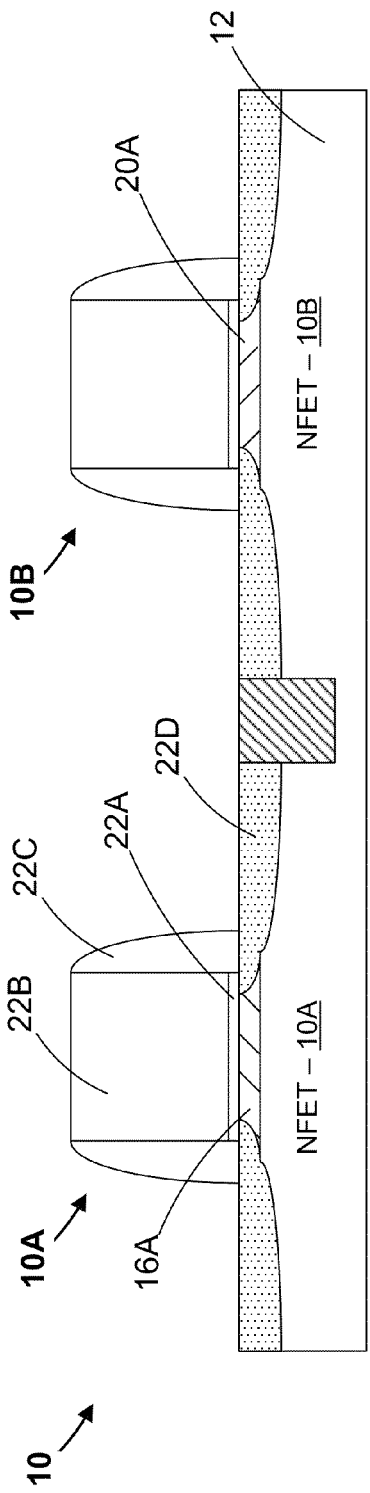
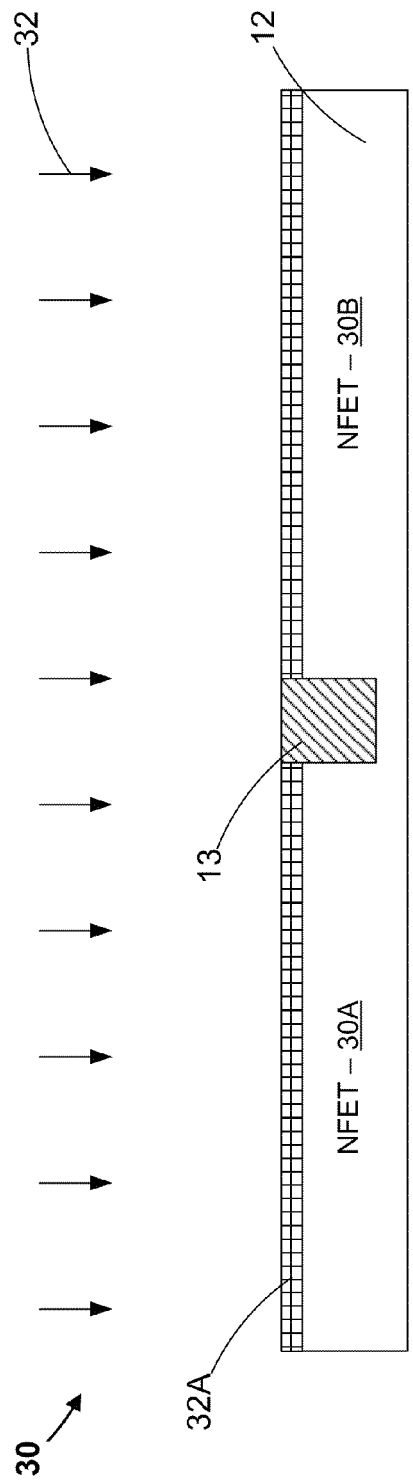

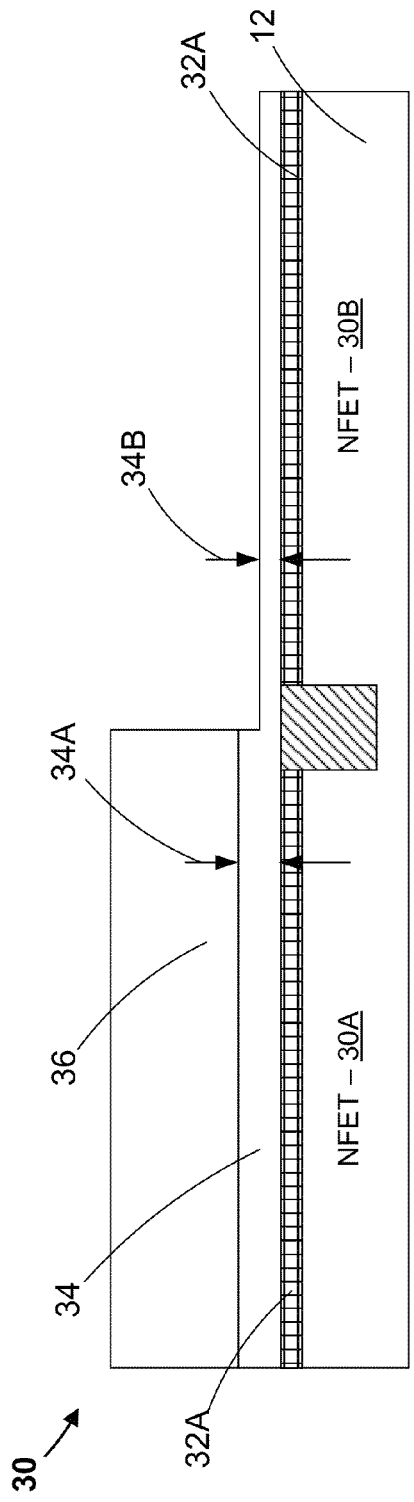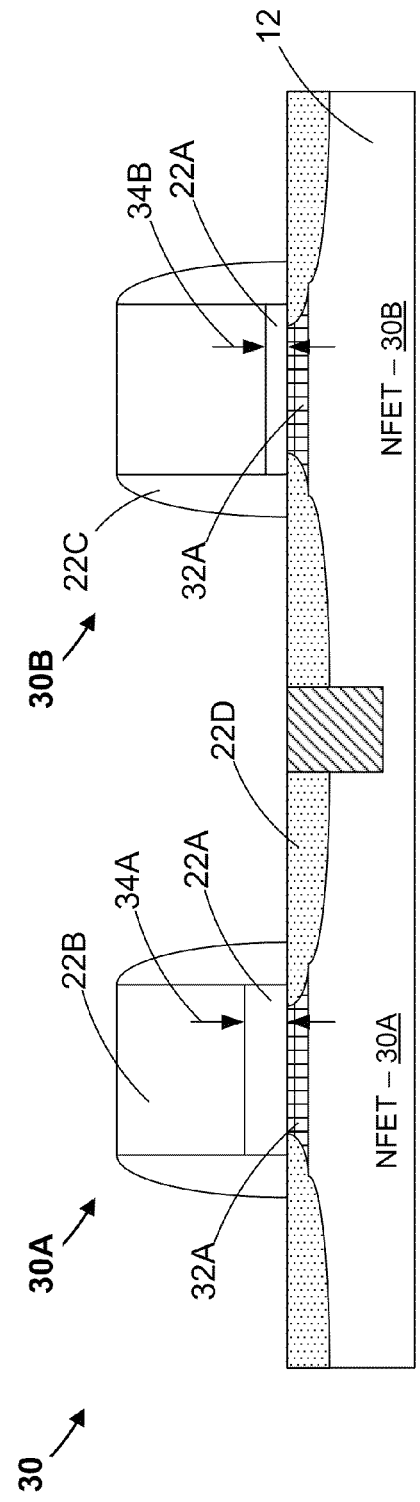

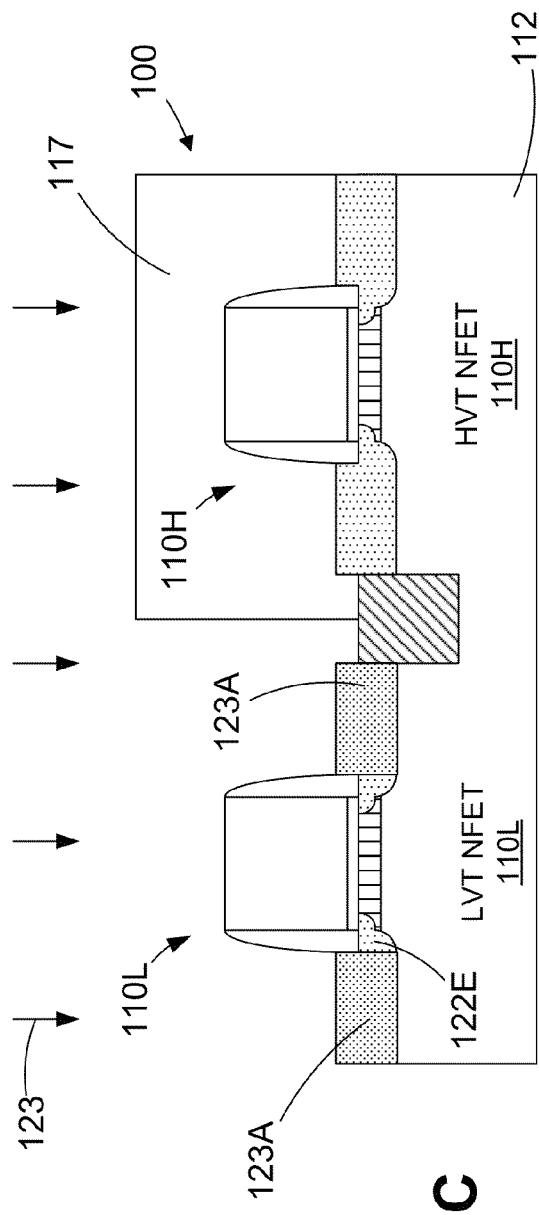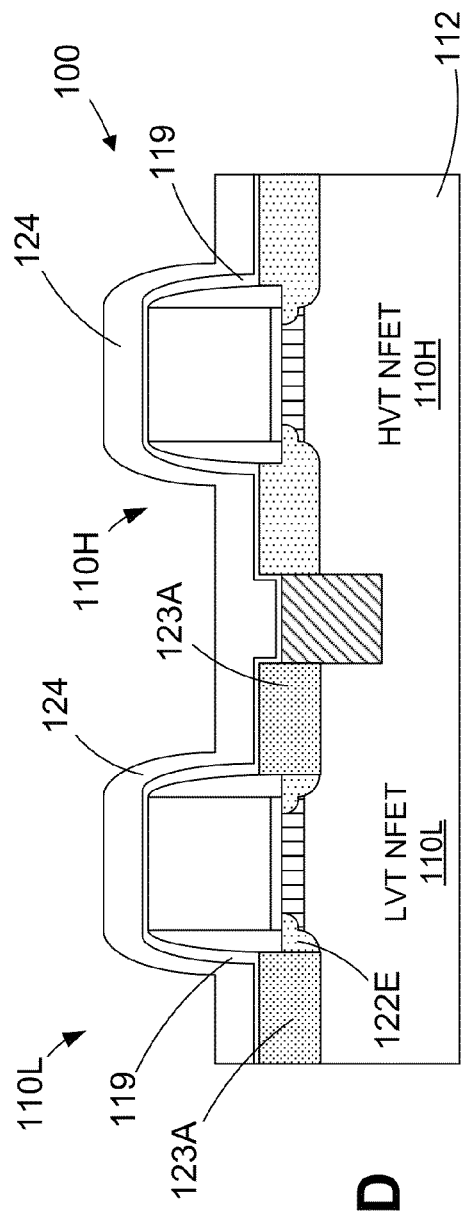
Figure 3C
Figure 3D

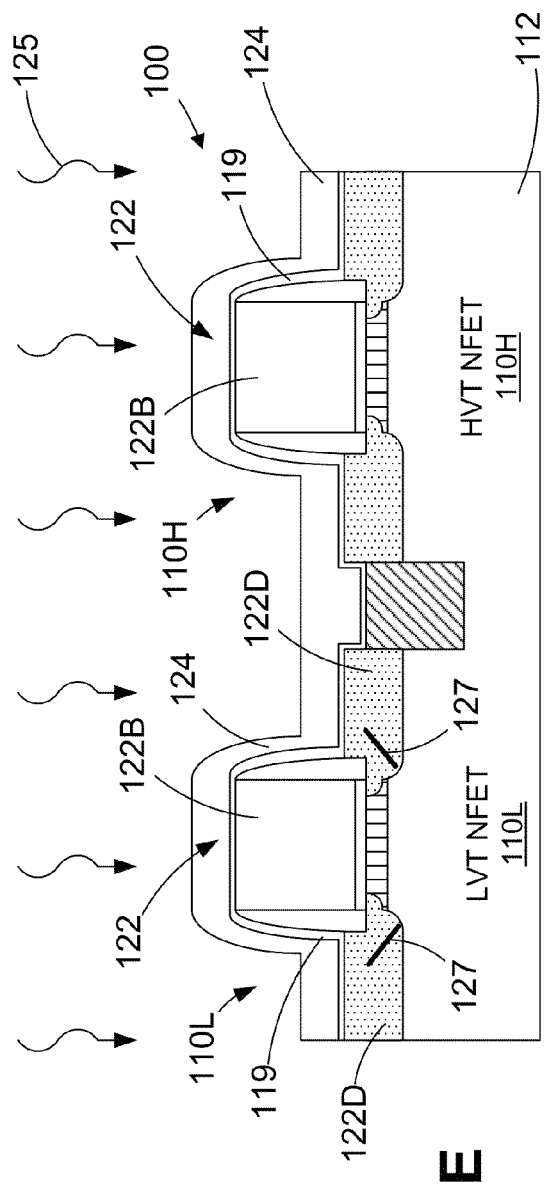
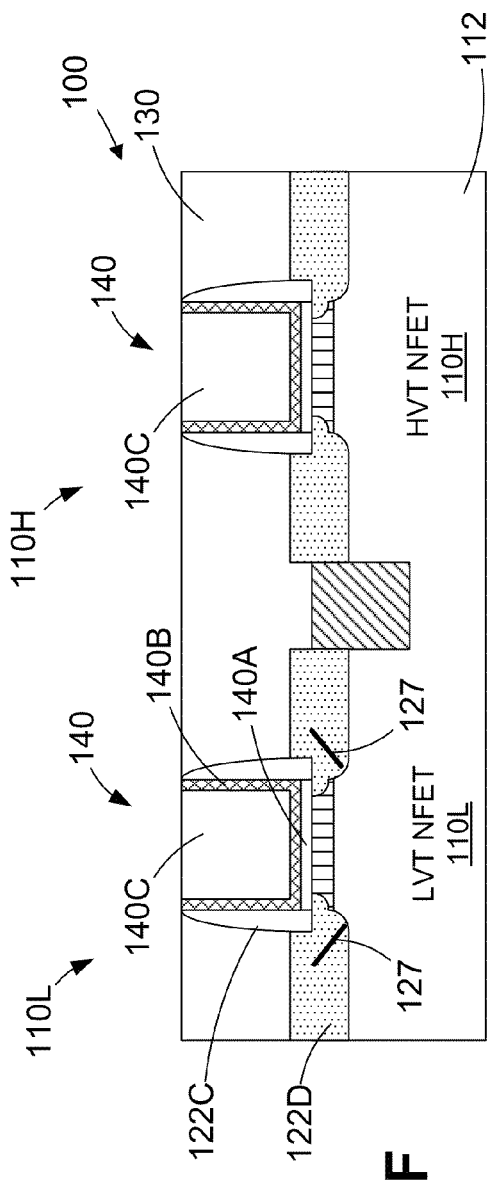

METHODS OF FORMING MULTIPLE N-TYPE SEMICONDUCTOR DEVICES WITH DIFFERENT THRESHOLD VOLTAGES ON A SEMICONDUCTOR SUBSTRATE

BACKGROUND OF THE INVENTION

1. Field of the Invention

Generally, the present disclosure relates to the manufacture of sophisticated integrated circuit products, and, more specifically, to various methods of forming multiple N-type semiconductor devices above a substrate, wherein the NFET devices have different threshold voltage ($V_t$) levels.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If the voltage applied to the gate electrode is less than the threshold voltage ($V_t$) of the device, then there is no current flow through the device (ignoring undesirable leakage currents, which are hopefully relatively small). However, when the voltage applied to the gate electrode is equal to or exceeds the threshold voltage ($V_t$) of the device, the channel region becomes conductive, and electrical current is permitted to flow between the source region and the drain region through the conductive channel region. During the fabrication of complex integrated circuit products using, for instance, CMOS technology, millions of transistors, e.g., N-channel transistors (NFET) and/or P-channel transistors (PFET), are formed on a substrate including a crystalline semiconductor layer.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

Device designers are under constant pressure to increase the operating speed and electrical performance of transistors and integrated circuit products that employ such transistors. Given that the gate length (the distance between the source and drain regions) on modern transistor devices may be approximately 20-50 nm, and that further scaling is anticipated in the future, device designers have employed a variety of techniques in an effort to improve device performance, e.g., the use of high-k dielectrics, the use of metal gate electrode structures, the incorporation of work function metals in the gate electrode structure, etc. One particular technique that has been employed to increase the performance of transistor devices involves so-called stress memorization techniques (SMT) wherein certain types of stresses are induced in the channel region of the device. More specifically, SMT techniques are used to create a tensile stress in the channel region for N-type transistors (to increase electron mobility). Stress engineering techniques typically involve 1) forming a patterned mask layer that exposes N-type transistors but covers any P-type transistors; 2) performing an amorphization implant process on the source/drain regions of the exposed N-type transistors; 3) removing the patterned mask layer; 4) forming a thin layer of silicon dioxide on the N-type transistors and the P-type transistors; 5) forming a specifically made silicon nitride layer on the silicon dioxide layer; 6) performing a brief re-crystallization anneal process (e.g., 650° C. for about 10 minutes in a nitrogen ambient); and 7) in some cases, performing one or more etching steps to remove the silicon nitride layer and the thin layer of silicon dioxide. During the etching process that is performed to remove the silicon nitride layer, the thin silicon dioxide layer protects the substrate and the sidewall spacers formed adjacent the gate structures of the devices. The above-described techniques employed in forming a desired tensile stress in the channel region of a FET are well known to those skilled in the art. The volume of the amorphized regions of the substrate, i.e., the amorphous silicon, is larger than the volume of the original silicon material that was amorphized. During the re-crystallization anneal process, the amorphous silicon is re-crystallized. When silicon changes from amorphous silicon to crystalline silicon, the volume of material will shrink, thereby creating the desired stress in the channel region of the device. This shrinking process also creates so-called stacking faults in the source/drain regions of the device as well. During the re-crystallization anneal process, the relatively stiff silicon nitride layer serves as a "volume confiner" to prevent stress relaxation during the re-crystallization process.

As noted above, the threshold voltage ($V_t$) of a transistor is a very important design parameter that greatly impacts the performance capabilities of the transistor device. In modern integrated circuit products, it is frequently the case that the product will have a plurality of N-type transistors that have different threshold voltage levels depending upon the functions provided by the circuit containing such transistors. In general, for transistors employed in applications requiring higher performance capabilities, such as logic or micro-processor circuits, the NFET transistors are designed to have the lowest threshold voltage level ($V_{t\ lowest}$) (hereinafter "LVT devices"). While such LVT devices typically exhibit a desirable high drive current, they may also exhibit undesirably high levels of leakage current, which may degrade device performance, e.g., an undesirable increase in power consumption. In contrast to the LVT devices, such an integrated circuit product may also contain transistors designed for low-power consumption applications. Transistors in such applications typically have a higher threshold voltage ($V_{t\ highest}$) (hereinafter "HVT devices" than that of the LVT devices. Such HVT devices may be employed in applications such as mobile phones, PDAs or other applications that rely on battery power. While such HVT devices typically exhibit a desirable low leakage current, and thus low power consumption, they may also exhibit undesirably low drive currents, which may degrade device performance, e.g., an undesirable decrease in switching speed, which tends to slow down the overall performance of the integrated circuit product.

One technique that is employed to vary the threshold voltage of N-type transistor devices involves performing separate and different so-called threshold voltage adjusting ion implantation processes on the channel regions of the different devices with a P-type dopant material. In general, for N-type devices, the higher the doping of the channel region during the threshold voltage adjusting implant process, the higher will be the threshold voltage of the resulting transistor device. FIGS. 1A-1C depict an illustrative example of this prior art technique. FIG. 1A depicts an integrated circuit product 10 wherein two illustrative NFET devices 10A, 10B will be formed in and above a semiconductor substrate 12 in separate active regions defined by an isolation structure 13. FIG. 1A depicts the product 10 at the point of fabrication wherein a patterned masking layer 14, e.g., a patterned layer of photoresist material, has been formed above the substrate 12 using known photolithography tools and techniques. The masking layer 14 masks the region of the substrate 12 where the NFET 10B will be formed but exposes the region of the substrate 12 where the NFET 10A will be formed. Thereafter, a first threshold voltage adjusting ion implant process 16 is performed to form a first threshold voltage adjusting implant region 16A in the region of the substrate 12 where the NFET device 10A will be formed.

FIG. 1B depicts the product after several process operations have been performed. First, the masking layer 14 (see FIG. 1A) was removed, and a second patterned masking layer 18 was formed above the substrate 12 using known photolithography tools and techniques. The masking layer 18 masks the region of the substrate 12 where the NFET 10A will be formed, and the implant region 16A, but exposes the region of the substrate 12 where the NFET 10B will be formed. Thereafter, a second threshold voltage adjusting ion implant process 20 is performed to form a second threshold voltage adjusting implant region 20A in the region of the substrate 12 where the NFET device 10B will be formed. The dopant concentration levels in the regions 16A, 20A are different, thereby resulting in the finished devices 10A, 10B having different threshold voltage levels.

FIG. 1C depicts the product 10 after additional components of the finished transistor devices 10A, 10B have been formed. Each of the devices comprises a schematically depicted gate insulation layer 22A, a gate electrode 22B, sidewall spacers 22C and source/drain regions 22D. Each of the devices exhibit different threshold voltage levels due to the different doping levels uses in forming the implant regions 16A, 20A.

Another prior art technique that is employed to vary the threshold voltages of N-type devices involves forming the devices with gate insulation layers of different thicknesses. In general, all other things being equal, the thicker the gate insulation layer, the greater will be the threshold voltage of the device. FIGS. 2A-2C depict an illustrative example of this prior art technique. FIG. 2A depicts an integrated circuit product 30 wherein two illustrative NFET devices 30A, 30B will be formed in and above the semiconductor substrate 12 in separate active regions defined by the isolation structure 13. FIG. 2A depicts the product 10 at the point of fabrication wherein a single threshold voltage adjusting ion implant process 32 is performed to form threshold voltage adjusting implant regions 32A in the regions of the substrate 12 where both of the NFET devices 30A, 30B will be formed.

FIG. 2B depicts the product 30 after several process operation have been performed. First, a layer of gate insulation material 34 was formed on the substrate 12, e.g., silicon dioxide. In the drawings, the relative thickness of the gate insulation material 34 has been exaggerated for purposes of explanation. The layer of gate insulation material 34 has an original thickness 34A and it may be formed by either a deposition process, as depicted, or by a thermal growth process, wherein the layer 34 would not form on the isolation structure 13. After the layer of gate insulation material 34 was formed, a patterned masking layer 36 was formed above the layer of gate insulation material 34 using known photolithography tools and techniques. The masking layer 36 masks the region of the substrate 12 where the NFET 30A, with a thicker gate insulation layer, will be formed, but exposes the region of the substrate 12 where the NFET 10B, with a relatively thinner gate insulation layer, will be formed.

FIG. 2C depicts the product 30 after additional components of the finished transistor devices 30A, 30B have been formed. Each of the devices comprises a schematically depicted gate insulation layer 22A, a gate electrode 22B, sidewall spacers 22C and source/drain regions 22D. However, since the devices 30A, 30B have gate insulation layers 22A of different thickness, each of the devices 30A, 30B exhibit different threshold voltage levels.

As can be seen from the forgoing, each of the prior art techniques involves performing numerous masking and ion implantation processes, both of which are time-consuming and expensive process operations in the world of semiconductor manufacturing. The situation becomes even more problematic and complex when an integrated circuit product that is being manufactured requires devices with three or more different threshold voltage levels, as the above process steps must be increased, all of which increases the time and expense of fabricating such integrated circuit products.

In the case of an integrated circuit product that employs LVT devices and HVT devices, but does not employ any SMT techniques to improve the performance of the devices, two separate ion implantation masking layers are employed and two separate threshold voltage adjusting ion implantation processes are performed (each with different dopant doses) to achieve the desired threshold voltage levels for each of the devices. For example, a first implant mask is formed that exposes one of the device types while masking the other type of devices, and the first threshold voltage adjusting ion implant process is performed. This process is then repeated for the other devices. The dopant dose used in the threshold voltage adjusting ion implant process for the LVT devices is lower than the dopant dose used in the threshold voltage adjusting ion implant process for the HVT devices. This results in the LVT devices and HVT devices having threshold voltage implant regions with a lower dopant concentration, e.g., about $10e^{15}$-$10e^{17}$ ions/cm$^3$ (for the LVT devices) and about $10e^{17}$-$10e^{19}$ ions/cm$^3$ (for the HVT devices). In such an application, the performance of the integrated circuit product is not as great as it would have been when SMT techniques are used in combination with the threshold voltage adjusting implants to improve device performance.

Additional complexities arise when SMT techniques are also employed in an attempt to increase the performance level of N-type devices. For example, when SMT techniques and threshold voltage implant techniques are both employed on a product that employs LVT devices and HVT devices, an additional third masking layer is needed to expose all of the N-type devices for an amorphization implantation process as part of the SMT processing, while covering all of the P-type devices. The SMT approach, if combined with replacement gate architecture, desirably lowers the threshold voltage for each of the N-type devices by shifting the conduction band gap of the silicon channel region and by reducing the band gap energy level of the silicon channel material. Unfortunately, the use of the additional SMT technique also undesirably increases the junction leakage currents of the N-type devices due to the reduction of the band gap of the silicon channel material. The increased leakage current is particularly undesirable for the HVT devices, as it adversely impacts the ability of such a degraded HVT device to meet the low power consumption levels that are needed for products that use HVT devices.

The present disclosure is directed to various methods of forming multiple N-type semiconductor devices above a substrate, wherein the N-type devices have different threshold voltage levels, that may solve or reduce some of the problems mentioned above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming multiple N-type semiconductor devices above a substrate, wherein the N-type devices have different threshold voltage ($V_t$) levels. One illustrative method disclosed herein involves forming an integrated circuit product comprised of first and second N-type transistors formed in and above first and second active regions, respectively. The method generally involves performing a common threshold voltage adjusting ion implantation process on the first and second active regions, forming the first and second transistors, performing an amorphization ion implantation process to selectively form regions of amorphous material in the first active region but not in the second active region, after performing the amorphization ion implantation process, forming a capping material layer above the first and second transistors and performing a re-crystallization anneal process to convert at least portions of the regions of amorphous material to a crystalline material. In some cases, the capping material layer may be formed of a material having a Young's modulus of at least 180 GPa.

Another illustrative method disclosed herein involves forming an integrated circuit product comprised of first and second N-type transistors formed in and above first and second active regions, respectively. The method generally involves performing a common threshold voltage adjusting ion implantation process on the first and second active regions, forming the first and second transistors in and above the first and second active regions and forming a masking layer that masks the second transistor but leaves the first transistor exposed for further processing. In this embodiment, the method further comprises performing an amorphization ion implantation process through the masking layer to selectively form regions of amorphous material in the first active region but not in the second active region, removing the masking layer, forming a capping material layer above the first and second transistors and performing a re-crystallization anneal process to convert at least portions of the regions of amorphous material to a crystalline material. In some cases, the capping material layer may be formed of a material having a Young's modulus of at least 180 GPa.

Yet another illustrative method disclosed herein involves forming an integrated circuit product comprised of first and second N-type transistors comprised of first and second replacement gate structures, respectively, wherein the first transistor has a lower threshold voltage than the second transistor and wherein the first and second N-type transistors are formed in and above first and second active regions, respectively. The method generally involves performing a common threshold voltage adjusting ion implantation process on the first and second active regions, forming first and second sacrificial gate transistors in and above the first and second active regions, wherein each of the sacrificial gate transistors comprises a sacrificial gate structure, and performing an amorphization ion implantation process to selectively form regions of amorphous material in the first active region but not in the second active region. In this embodiment, the method further comprises, after performing the amorphization ion implantation process, forming a capping material layer above the first and second sacrificial gate transistors, performing a re-crystallization anneal process to convert at least portions of the regions of amorphous material to a crystalline material, performing at least one process operation to remove the sacrificial gate structures of the first and second sacrificial gate transistors to thereby define first and second gate cavities, respectively, and forming the first and second replacement gate structures in the first and second gate cavities, respectively.

BRIEF DESCRIPTION OF THE DRAWINGS

The disclosure may be understood by reference to the following description taken in conjunction with the accompanying drawings, in which like reference numerals identify like elements, and in which:

FIGS. 1A-1C depict one illustrative prior art technique of adjusting threshold voltage levels on transistor devices;

FIGS. 2A-2C depict another illustrative prior art technique of adjusting threshold voltage levels on transistor devices;

FIGS. 3A-3F depict various methods disclosed herein of forming multiple N-type semiconductor devices above a substrate, wherein the N-type devices have different threshold voltage ($V_t$) levels;

Figure 1A:
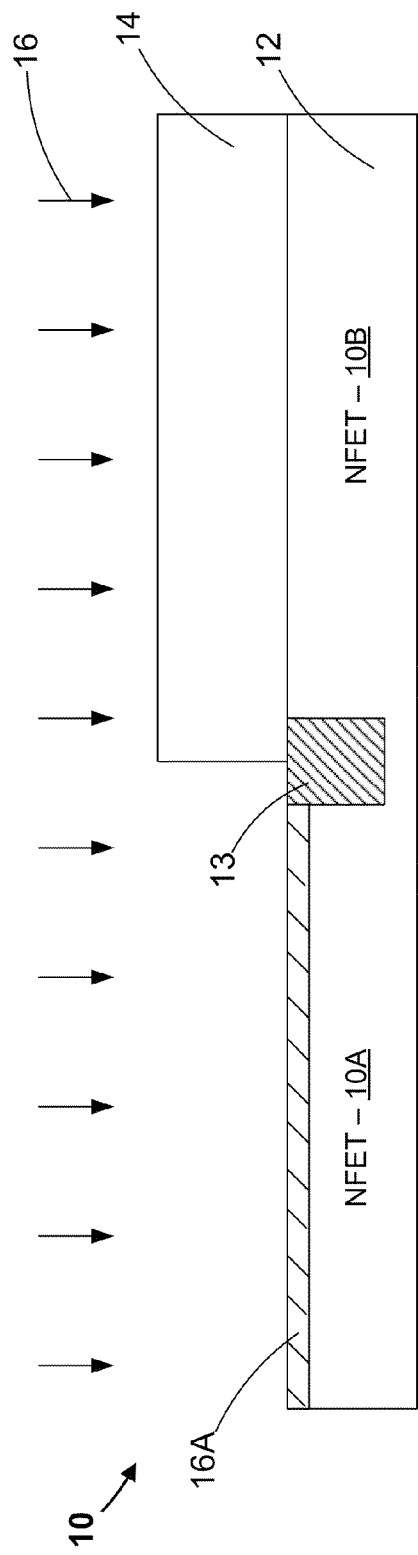
Figure 1B:
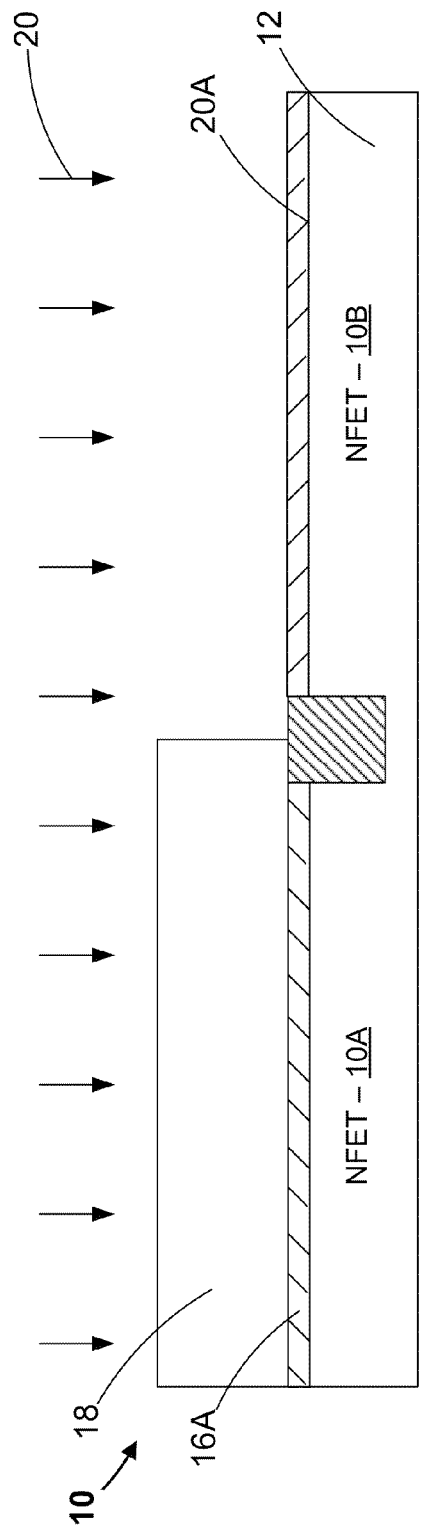

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming multiple N-type semiconductor devices above a substrate, wherein the N-type devices have different threshold voltage ($V_t$) levels, while reducing or perhaps eliminating at least some of the problems discussed in the background section of this application. As will be readily apparent to those skilled in the art upon a complete reading of the present application, the present method is applicable to a variety of technologies, e.g., planar NFET, N-type FinFET, etc., and is readily applicable to a variety of devices, including, but not limited to, logic devices, memory devices, resistors, conductive lines, etc. With reference to the attached figures, various illustrative embodiments of the methods devices disclosed herein will now be described in more detail.

Figure 3A:
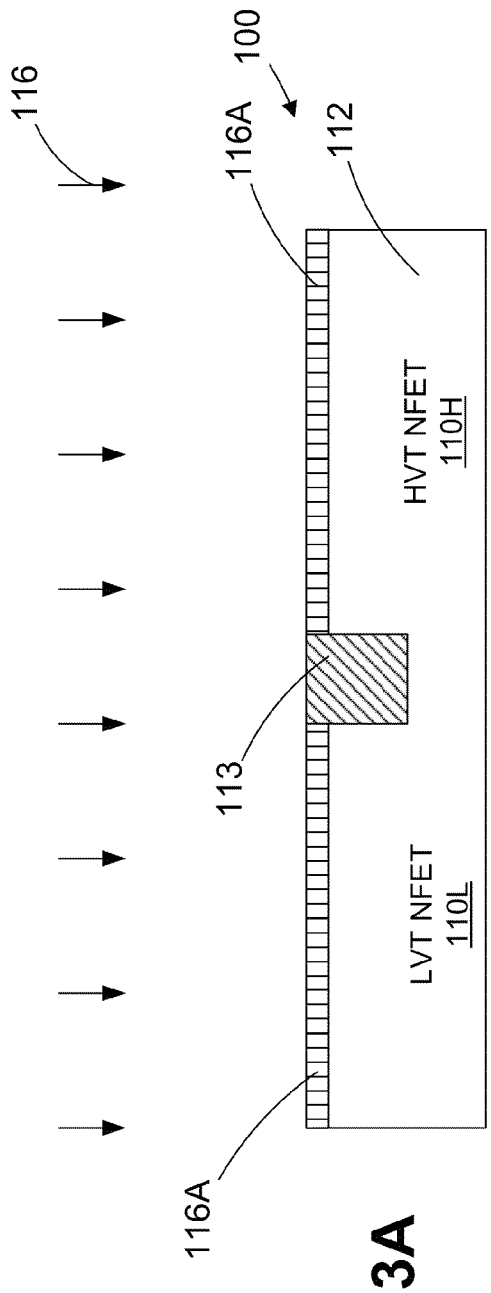

FIG. 3A is a simplified view of an illustrative integrated circuit product 100 at an early stage of manufacturing that is formed above a semiconductor substrate 112. When completed, the product 100 will be comprised of two categories or types of N-type transistors, wherein each type of N-type transistor is intended to have a different threshold voltage level. More specifically, when completed, the integrated circuit product 100 will be comprised of two illustrative NFET transistors LVT NFET 110L and HVT NFET 110H, each of which are designed to have different threshold voltage levels. The transistors 110L and 110H are formed in and above separated active regions defined in the substrate 112 by an illustrative trench isolation structure 113. The substrate 112 may have a variety of configurations, such as the depicted bulk silicon configuration. The substrate 112 may also have a silicon-on-insulator (SOI) configuration that includes a bulk silicon layer, a buried insulation layer and an active layer, wherein semiconductor devices are formed in and above the active layer. The substrate 112 may also be made of materials other than silicon. Thus, the terms "substrate" or "semiconductor substrate" should be understood to cover all semiconductor structures.

The transistor LVT NFET 110L is designed to have a lower threshold voltage level that that of the transistor HVT NFET 110H. The transistor LVT NFET 110L may be employed in applications requiring higher performance capabilities, such as logic or micro-processor circuits, etc. The transistor HVT NFET 110H may be employed in, for example, low power consumption applications. The absolute values for the threshold voltages for each of the devices 110L and 110H may vary depending upon the particular application, but, for purposes of the inventions disclosed herein, it is only important that they are designed and intended to have different relative threshold voltage levels.

At the point of fabrication depicted in FIG. 3A, the trench isolation region 113 has been formed in the substrate 112 to thereby define the active regions where the transistors 110L and 110H will be formed. A patterned masking layer (not shown), e.g., a patterned layer of photoresist material or a patterned hard mask layer, is formed above the substrate 112 using known photolithography tools and/or techniques. The masking layer exposes the region of the substrate 112 where the devices 110L and 110H will be formed. Thereafter, a threshold voltage adjusting ion implant process 116 is performed to form threshold voltage adjusting implant regions 116A in regions of the substrate 112 where the transistors 110L and 110H will be formed. The parameters of the implant process 116 may vary depending upon the particular application, but the implantation process 116 will be performed using a P-type dopant, such as boron, as the dopant material. Moreover, the implantation process 116 is designed to provide the desired final threshold voltage level for the device 110H, the one with the higher designed threshold voltage level. In one illustrative embodiment, the resulting implant regions 116A may have a dopant concentration of about $10e^{17}$-$10e^{19}$ ions/cm$^3$.

As shown more fully below, selective SMT techniques are employed such that, upon completion, the two illustrative NFET transistors 110L and 110H will each have different threshold voltage levels, but the device 110H will not be degraded due to the use of SMT techniques, i.e., the junction leakage current of the device 110H will not be increased as was the case with using the prior art SMT process flow on all of the N-type devices formed above the substrate, as described in the background section of this application.

Figure 3B:
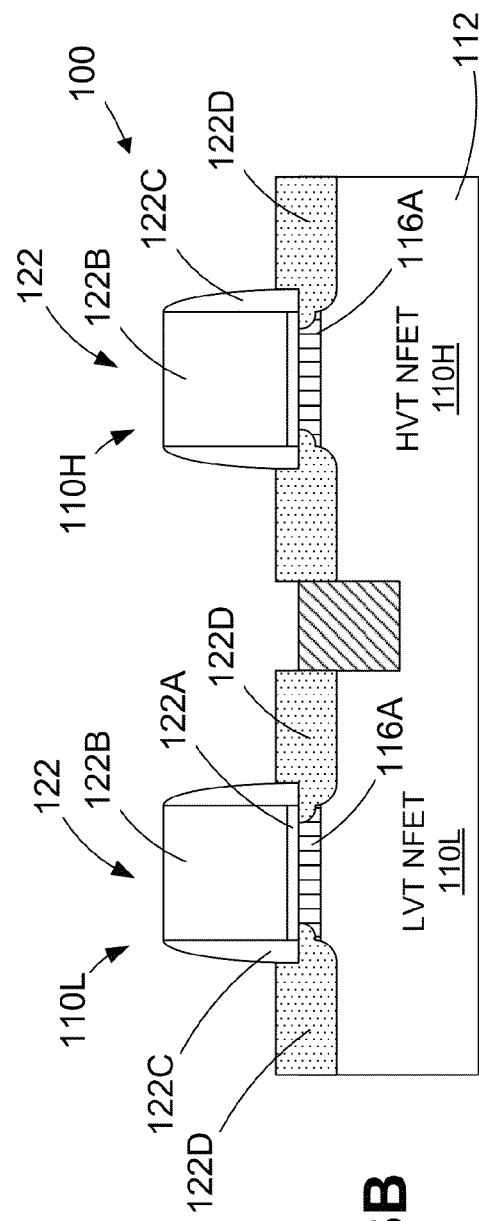

FIG. 3B depicts the product 100 after additional components of the finished NFET transistor devices 110L and 110H have been formed, as well as illustrative sacrificial gate structures 122. In general, in the depicted examples, the gate structures of the completed devices 110L and 110H will be so-called high-k/metal gate structures 140 (see FIG. 3F) that are manufactured using well-known replacement gate manufacturing techniques. However, at the point of fabrication depicted in FIG. 3B, the illustrative sacrificial gate structures 122 remain in place. Each of the sacrificial gate structures 122 comprises a schematically depicted sacrificial gate insulation layer 122A, e.g., a layer of silicon dioxide, and a sacrificial gate electrode 122B. Also depicted are sidewall spacers 122C and raised source/drain regions 122D. The sidewall spacers 122C and the source/drain regions 122D will become part of the finished devices 110L and 110H. At the point of fabrication depicted in FIG. 3B, various implant regions have been formed, e.g., halo implants, extension implants, etc. The depiction of the transistor structures in FIG. 3B is intended to be representative in nature of any type of N-type transistor device. Thus, the schematic depiction of the devices in FIG. 3B should not be considered to be limiting as it relates to the scope of the inventions disclosed herein. In general, the inventions disclosed herein may be employed with any of a variety of different types of N-type transistors regardless of their shape or configuration or specific materials of construction, wherein the transistors are intended to have different threshold voltage levels. For example, although the inventions have been disclosed in the context of a product 100 that contains a plurality of planar FET N-type transistors, the methods disclosed herein could be equally applied to a product that contained a plurality of N-type FinFET transistors or a combination of N-type planar and FinFET transistor devices. As noted above, the illustrative gate structures for the transistors 110L and 110H may be formed using so-called "gate-last" or "replacement gate" manufacturing techniques.

The transistors 110L and 110H may be provided with any number of sidewall spacers, and the source/drain regions 122D may be formed using any of a variety of known ion implantation processing schemes.

The next major process objective is to selectively apply SMT techniques to the device 110L but not the device 110H to thereby further selectively reduce the threshold voltage level of only the device 110L. As will be appreciated by those skilled in the art, the selective use of SMT techniques on only one of the two different categories of NFET devices, i.e., different threshold voltage levels, is in contrast to prior art processes wherein such SMT techniques would have been performed on both of the devices 110L and 110H. As shown in FIG. 3C, the process begins with the formation of a schematically depicted patterned masking layer 117, e.g., a patterned layer of photoresist material or a patterned hard mask layer, above the substrate 112 using known photolithography tools and/or etching techniques. The masking layer 117 masks the device 110H but exposes the device 110L for further processing. Thereafter, an amorphization ion implant process 123 is performed on the exposed device 110L to amorphize exposed regions of the substrate, i.e., the exposed portions of the source/drain regions 122E of the exposed device 110L. The amorphization ion implant process 123 results in the formation of schematically and illustratively depicted amorphous silicon regions 123A for the device 110L. The parameters of the implant process 123 may vary depending upon the particular application. In one illustrative embodiment, the implant process 123 may be performed using a dopant dose of about $10e^{14}$-$10e^{15}$ ions/cm$^2$, and an implant energy level of about 40-60 keV using, for example, germanium or silicon as the implanted material.

Next, as shown in FIG. 3D, the masking layer 117 has been removed and a protection layer 119 (e.g., silicon dioxide) and a capping material layer 124 have been formed above the transistors 110L and 110H. In one embodiment, the capping material layer 124 may be made of a material having a Young's modulus of at least 180 GPa, such as, for example, silicon nitride, Al$_2$O$_3$, HfO$_2$, etc. In one particular embodiment, the capping material layer 124 may be formed so as to have a thickness of about 10-50 nm. The capping material layer 124 may be formed using a CVD or ALD process wherein the parameters of the CVD or ALD process are adjusted and controlled such that, if desired, the capping material layer 124 exhibits any desired stress condition, e.g., tensile, compressive, neutral. The manner in which this is accomplished is well known to those skilled in the art. The capping material layer 124 may be employed as part of the SMT process wherein the ultimate objective is to impart a desired tensile stress to the channel region of the transistor 110L so as to increase the mobility of the charge carriers for that device, i.e., electrons, to further reduce the threshold voltage of the device 110L and improve its electrical performance characteristics, e.g., switching speed.

Then, as shown in FIG. 3E, a re-crystallization anneal process 125 is performed on the product 100, i.e., on both of the devices 110L and 110H. The temperature and duration of the anneal process 125 may vary depending upon the particular application. In one illustrative embodiment, the re-crystallization anneal process 125 may be performed at a temperature of about 650° C. for a duration of about 10 minutes in a nitrogen ambient. The re-crystallization anneal process re-crystallizes the amorphous silicon region 123A back to crystalline silicon, i.e., compare FIGS. 3D and 3E. The re-crystallization anneal process 125 also results in the formation of illustrative stacking faults 127 in the source/drain regions 122D for the device 110L. However, the device 110H does not include such stacking faults because it was not subjected to the amorphization implant process 123.

FIG. 3F depicts the product 100 after several process operations have been performed. First, one or more etching processes were performed to remove the protection layer 119 and the capping material layer 124. Thereafter, traditional replacement gate manufacturing operations were performed to form the illustrative high-k/metal gate replacement gate structures 140 for both of the devices 110L and 110H. In general, the replacement gate process begins with the deposition of a layer of insulating material 130 above the product 100. Thereafter, a CMP process was performed to planarize the upper surface of the layer of insulating material 130. The polishing process would eventually stop on or expose the sacrificial gate electrode 122B (see FIG. 3E) of the sacrificial gate structures 122 of the devices 110L and 110H. The next operation involves performing one or more etching processes to remove the sacrificial gate structures 122 leaving gate cavities between the spacers 122C. Then, the various material layers that would be deposited to form the replacement gate structures 140 would be sequentially formed above the product 100 and in the gate cavities formerly occupied by the sacrificial gate structures 122. The final step in the replacement gate process would be to perform one or more CMP processes to remove excess materials positioned outside of the gate cavities to arrive at the replacement gate structures 140 depicted in FIG. 3F.

Each of the replacement gate structures 140 comprises a schematically depicted interfacial layer 140A, e.g., a layer of silicon dioxide, gate insulation layer 140B and one or more conductive layers that act as the gate electrode 140C. The previously formed sidewall spacers 122C and source/drain regions 122D are also depicted in FIG. 3F. Again, the depiction of the transistor structures in FIG. 3F is intended to be representative in nature of any type of N-type transistor device. Thus, the schematic depiction of the devices in FIG. 3F should not be considered to be limiting as it relates to the scope of the inventions disclosed herein. In general, the inventions disclosed herein may be employed with any of a variety of different types of N-type transistors regardless of their shape or configuration or specific materials of construction, wherein the transistors are intended to have different threshold voltage levels. The gate insulation layer 140B may be made of a variety of different materials, such as, for example, a so-called high-k (k greater than 7) insulation material, like hafnium oxide, etc. Similarly, the conductive materials that define the gate electrode 140C may also be of a material such as polysilicon, amorphous silicon, one or more metal layers, such as, for example, TiN, TiAl, TaN, W, Co, etc.

At the point of fabrication depicted in FIG. 3F, traditional manufacturing techniques may be employed to complete the fabrication of the product 100. For example, various conductive contacts (not shown) may be formed in the layer of insulating material 130 to establish electrical connection to the source/drain regions 122D using traditional materials and techniques. Thereafter, although not depicted in the drawings, various metallization structures are formed above the product 100.

Figure 3H:
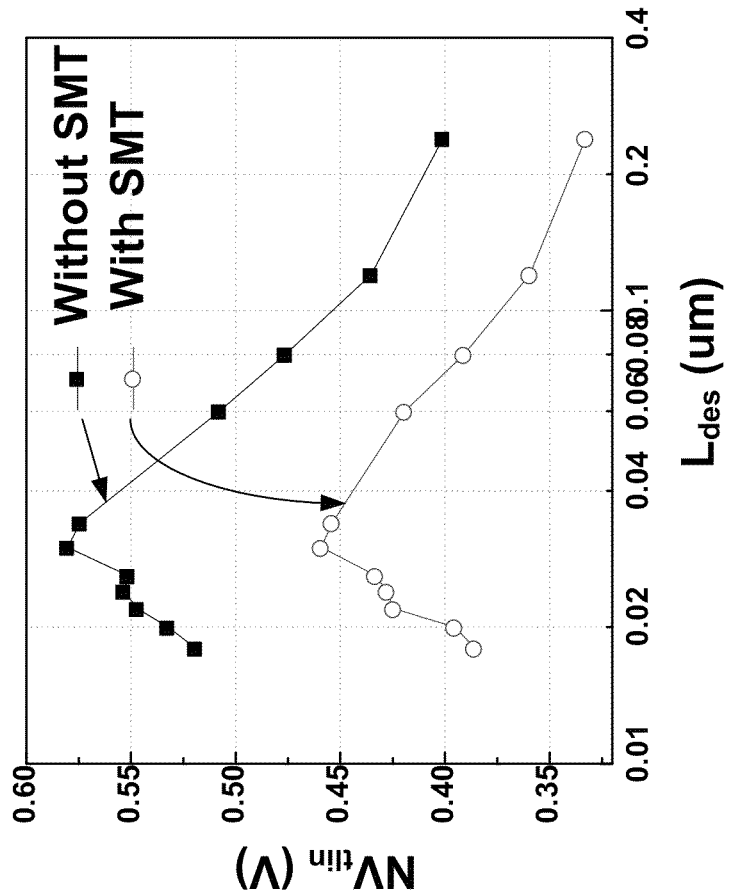
FIG. 3H is a graph that depicts the performance enhancement of replacement gate NFET devices using the novel SMT techniques disclosed herein.
Figure 3G:
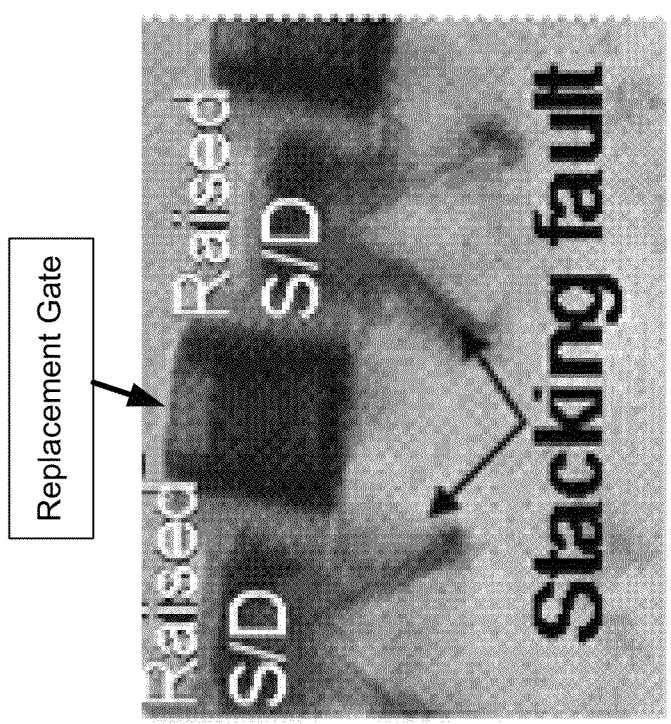
FIG. 3G is a TEM image that shows the formation of stacking faults in a transistor that was formed using replacement gate techniques due to the use of SMT techniques.

FIG. 3G is a TEM image of an NFET transistor device that was manufactured using replacement gate techniques. This image clearly shows the formation of stacking faults in the raised source/drain regions of the device. Such stacking faults are earmarks of SMT-induced plastic deformation. In the present application, such stacking faults are only induced in the source/drain regions of the device 110L.

FIG. 3H is a graph that depicts threshold voltage "tuning" of a replacement gate NFET transistor using the novel methods disclosed herein. More specifically, FIG. 3H depicts a comparison between NFET devices that were manufactured with and without employing SMT techniques. In FIG. 3H, the horizontal axis reflects the design gate length of the NFET transistors, while the vertical axis is the measured threshold voltage levels for the devices. From the data presented in FIG. 3H, it is clear that, by using SMT techniques on NFET devices with replacement gate architecture, the methods disclosed herein may be employed to effectively tune the threshold voltage of such NFET devices, which may be usefully employed in several applications such as, for example, satisfying multiple applications in system-on-chip designs.

Using the novel methods disclosed herein, the capping material layer 124 does not further reduce, at least not to any significant extent, the threshold voltage level of the device 110H beyond the threshold voltage level resulting from the threshold voltage adjusting implantation process 116. Since the source/drain regions 122D of the device 110H were not subject to the amorphization implant process 123, no amorphous regions were formed in the source/drain regions 122D of the device 110H. Accordingly, the junction leakage current of the device 110H is not increased, thereby leading to reduced power consumption by the device 110H, which is intended to have a relatively higher threshold voltage. If the amorphization implant process 123 had been performed on the device 110H and the capping material layer 124 would have thereafter been formed on the device 110H, it would have resulted in the device 110H having a lower threshold voltage and it may have caused the device 110H to exhibit an undesirable high level of junction leakage currents. Moreover, in this case, if the HVT device 110H had been subjected to the same threshold voltage implant process and the same SMT treatment, the two devices would exhibit the same threshold voltage, which is contrary to the primary design objective. Thus, by using the novel methods disclosed herein that involves selectively applying SMT techniques on only the device 110L but not on the device 110H, SMT techniques may be used to desirably reduce the threshold voltage of the devices 110L while not adversely increasing the power consumption of the devices 110H.

Additionally, and importantly, using the methods disclosed herein, the devices 110L and 110H are formed so as to have the required different voltage levels using a more efficient and less expensive process flow. As noted in the background section of this application, the prior art process that used SMT techniques and threshold voltage adjusting ion implantation techniques to form two different types of N-type devices with different threshold voltages levels involved performing two separate threshold voltage adjusting ion implantation processes (one for each device) and required the formation of three masking layers—two ion implantation masks (one for each of the devices) and one SMT mask that expose both devices and allowed the amorphization implantation process to be performed on both devices. In contrast, using the methods disclosed herein, the devices 110L and 110H may be formed using only one threshold voltage adjusting implantation mask (not shown but used in FIG. 3A) when forming the implant regions 116A, and one SMT mask 122 that covers one of the two devices (the device 110H) and only allows the amorphization implant process 123 to be performed on the other of the two devices (the device 110L). Thus, the methods disclosed herein provide a valuable and efficient alternative to prior art processing schemes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an integrated circuit product comprised of first and second N-type transistors, wherein said first and second transistors are formed in and above first and second active regions, respectively, comprising:
    performing a common threshold voltage adjusting ion implantation process on said first and second active regions;
    forming said first and second N-type transistors in and above said first and second active regions;
    forming a masking layer that masks said second transistor but leaves said first transistor exposed for further processing;
    performing an amorphization ion implantation process through said masking layer on said exposed first transistor so as to form regions of amorphous material in said first active region;
    removing said masking layer;
    forming a capping material layer above said first and second transistors and above said first and second active regions, said capping material layer comprising a material having a Young's modulus of at least 180 GPa; and
    after forming said material layer, performing a re-crystallization anneal process to convert at least portions of said regions of amorphous material to a crystalline material.

2. The method of claim 1, wherein said common threshold voltage adjusting ion implantation process is performed using a P-type dopant.

3. The method of claim 1, wherein said second transistor has a higher threshold voltage than said first transistor and wherein said common threshold voltage adjusting ion implantation process is performed using a dopant dose that is selected so as to cause said second transistor device to exhibit said higher threshold voltage level.

4. The method of claim 1, wherein, prior to forming said capping material layer, the method further comprises forming a protection layer comprised of silicon dioxide above said first and second transistors and above said first and second active regions, said capping material layer being formed on said protection layer.

5. The method of claim 1, wherein performing said re-crystallization anneal process comprises performing an anneal process at a temperature of about 650° C. for a duration of about 10 minutes.

6. The method of claim 1, wherein performing said re-crystallization anneal process converts substantially all of said regions of amorphous material to a crystalline material.

7. The method of claim 1, wherein said first and second N-type transistors are each planar NFET transistors.

8. The method of claim 1, wherein said first and second transistors comprise sacrificial gate structures and wherein the method further comprises:
    performing at least one process operation to remove said sacrificial gate structures of said first and second transistors to thereby define first and second gate cavities, respectively; and
    forming first and second replacement gate structures in said first and second gate cavities, respectively.

9. The method of claim 8, wherein said replacement gate structures comprise a high-k layer of insulating material and at least one layer of metal.

10. The method of claim 8, wherein said second transistor has a higher threshold voltage than said first transistor and wherein said common threshold voltage adjusting ion implantation process is performed using a dopant dose that is selected so as to cause said second transistor device to exhibit said higher threshold voltage level.

11. The method of claim 8, wherein said first transistor has a lower threshold voltage than said second transistor.

12. The method of claim 1, wherein said capping material layer is formed so as to exhibit a tensile stress.

13. A method of forming an integrated circuit product comprised of first and second N-type transistors, wherein said first and second transistors are formed in and above first and second active regions, respectively, comprising:
  performing a common threshold voltage adjusting ion implantation process on said first and second active regions;
  forming said first and second N-type transistors in and above said first and second active regions;
  performing an amorphization ion implantation process to selectively form regions of amorphous material in said first active region but not in said second active region;
  after performing said amorphization ion implantation process, forming a capping material layer above said first and second transistors and above said first and second active regions; and
  after forming said capping material layer, performing a re-crystallization anneal process to convert at least portions of said regions of amorphous material to a crystalline material.

14. The method of claim 13, wherein said common threshold voltage adjusting ion implantation process is performed using a P-type dopant.

15. The method of claim 13, wherein said second transistor has a higher threshold voltage than said first transistor and wherein said common threshold voltage adjusting ion implantation process is performed using a dopant dose that is selected so as to cause said second transistor device to exhibit said higher threshold voltage level.

16. The method of claim 13, wherein, prior to forming said capping material layer, the method further comprises forming a protection layer comprised of silicon dioxide above said first and second transistors and above said first and second active regions, said capping material layer being formed on said protection layer.

17. The method of claim 13, wherein performing said re-crystallization anneal process comprises performing an anneal process at a temperature of about 650° C. for a duration of about 10 minutes.

18. The method of claim 13, wherein performing said re-crystallization anneal process converts substantially all of said regions of amorphous material to a crystalline material.

19. The method of claim 13, wherein said first and second N-type transistors are each planar NFET transistors.

20. The method of claim 13, wherein said first and second transistors comprise sacrificial gate structures and wherein the method further comprises:
  performing at least one process operation to remove said sacrificial gate structures of said first and second transistors to thereby define first and second gate cavities, respectively; and
  forming first and second replacement gate structures in said first and second gate cavities.

21. The method of claim 20, wherein said replacement gate structures comprise a high-k layer of insulating material and at least one layer of metal.

22. The method of claim 20, wherein said second transistor has a higher threshold voltage than said first transistor and wherein said common threshold voltage adjusting ion implantation process is performed using a dopant dose that is selected so as to cause said second transistor device to exhibit said higher threshold voltage level.

23. The method of claim 20, wherein said first transistor has a lower threshold voltage than said second transistor.

24. The method of claim 13, wherein said capping material layer comprises a material having a Young's modulus of at least 180 GPa.

25. A method of forming an integrated circuit product comprised of first and second N-type transistors comprised of first and second replacement gate structures, respectively, wherein said first transistor has a lower threshold voltage than said second transistor and wherein said first and second N-type transistors are formed in and above first and second active regions, respectively, comprising:
  performing a common threshold voltage adjusting ion implantation process on said first and second active regions;
  forming first and second sacrificial gate transistors in and above said first and second active regions, each of said sacrificial gate transistors comprising a sacrificial gate structure;
  performing an amorphization ion implantation process to selectively form regions of amorphous material in said first active region but not in said second active region;
  after performing said amorphization ion implantation process, forming a capping material layer above said first and second sacrificial gate transistors and above said first and second active regions;
  after forming said capping material layer, performing a re-crystallization anneal process to convert at least portions of said regions of amorphous material to a crystalline material;
  performing at least one process operation to remove said sacrificial gate structures of said first and second sacrificial gate transistors to thereby define first and second gate cavities, respectively; and
  forming said first and second replacement gate structures in said first and second gate cavities, respectively.

26. The method of claim 25, wherein said common threshold voltage adjusting ion implantation process is performed using a P-type dopant.

27. The method of claim 25, wherein said second N-type transistor has a higher threshold voltage than said first N-type transistor and wherein said common threshold voltage adjusting ion implantation process is performed using a dopant dose that is selected so as to cause said second N-type transistor device to exhibit said higher threshold voltage level.

28. The method of claim 25, wherein performing said re-crystallization anneal process comprises performing an anneal process at a temperature of about 650° C. for a duration of about 10 minutes.

29. The method of claim 25, wherein performing said re-crystallization anneal process converts substantially all of said regions of amorphous material to a crystalline material.

30. The method of claim 25, wherein said first and second replacement gate structures comprise a high-k layer of insulating material and at least one layer of metal.

31. The method of claim 25, wherein said capping material layer comprises a material having a Young's modulus of at least 180 GPa.

* * * * *